(12) United States Patent
Bouisse et al.

(10) Patent No.: US 6,414,562 B1
(45) Date of Patent: Jul. 2, 2002

(54) CIRCUIT AND METHOD FOR IMPEDANCE MATCHING

(75) Inventors: Gerard Jean Louis Bouisse, Tempe, AZ (US); John E. Morgan, Albany, OR (US)

(73) Assignee: Motorola, Inc., Shaumburg, IL (US)

( * ) Notice: Subject to any disclaimer, the term of this patent is extended or adjusted under 35 U.S.C. 154(b) by 0 days.

(21) Appl. No.: 08/863,153

(22) Filed: May 27, 1997

(51) Int. Cl.[7] .............................. H04B 1/04; H03H 7/38
(52) U.S. Cl. ...................... 333/32; 333/17.3; 333/174; 455/123
(58) Field of Search .................. 333/17.3, 32, 174; 455/123–126; 330/129

(56) References Cited

U.S. PATENT DOCUMENTS

| | | | | |
|---|---|---|---|---|
| 2,981,902 A | * | 4/1961 | Familier | 333/32 |
| 3,852,669 A | | 12/1974 | Bowman et al. | 455/117 |
| 4,015,223 A | * | 3/1977 | Cheze | 333/32 X |
| 4,019,150 A | | 4/1977 | Lurey et al. | 455/117 |
| 4,612,669 A | * | 9/1986 | Nossen | 333/17.3 X |
| 5,140,223 A | * | 8/1992 | Gesche et al. | 333/32 X |
| 5,376,895 A | * | 12/1994 | Aihara | 330/129 |
| 5,423,082 A | | 6/1995 | Cygan et al. | 455/126 |
| 5,424,691 A | * | 6/1995 | Sadinsky | 333/17.3 |
| 5,459,440 A | * | 10/1995 | Claridge et al. | 333/32 X |
| 5,542,096 A | | 7/1996 | Cygan et al. | 455/115 |
| 5,564,086 A | * | 10/1996 | Cygan et al. | 333/17.3 X |

* cited by examiner

*Primary Examiner*—Robert Pascal
*Assistant Examiner*—Stephen E. Jones
(74) *Attorney, Agent, or Firm*—Rennie William Dover; Ziye Joe Zhou

(57) ABSTRACT

An impedance matching circuit (10) matches the impedance of a load (19) coupled to an RF amplifier (12) to that of the RF amplifier (12). The impedance matching circuit (10) samples a transmitted signal from the RF amplifier (12) and a reflected signal from the load (19). The amplitude and the phase of the sampled reflected signal are compared with those of the sampled transmitted signal to calculate the impedance mismatch. A control logic circuit (80) adjusts the capacitance and inductance values of variable capacitance (23; 27) and inductance (35) elements in the impedance matching circuit (10), thereby matching the impedance of the load (19) to that of the RF amplifier (12).

15 Claims, 2 Drawing Sheets

CIRCUIT AND METHOD FOR IMPEDANCE MATCHING

BACKGROUND OF THE INVENTION

The present invention relates, in general, to semiconductor circuits and, more particularly, to Radio Frequency (RF) circuits.

The performance of an RF power amplifier depends on the impedance of a load coupled to the output of the RF power amplifier. An RF power amplifier is generally designed to perform optimally when the load impedance has a predetermined value such as, for example, 50 ohms (Ω). When the load impedance differs from the predetermined value, the performance, such as output power, efficiency, linearity, etc., of the power amplifier is degraded.

In communication applications, an RF power amplifier is typically used to amplify an RF signal before the RF signal is transmitted through an antenna. The impedance of the antenna depends on the environment in which the antenna operates. In order to maintain an optimum performance of the power amplifier in various environments, an isolator is coupled between the power amplifier and the antenna. The isolator, which is also referred to as a circulator, has a first terminal coupled to the output of the power amplifier, a second terminal coupled to the antenna, and a third terminal coupled to ground via a device having a fixed impedance, e.g., 50 Ω. The output signal of the power amplifier is transmitted to the antenna through the first and second terminals of the isolator. The signal reflected back from the antenna due to an impedance mismatch is transmitted to ground via the third terminal of the isolator and the fixed impedance device. Thus, the impedance mismatch of the antenna does not affect the performance of the power amplifier. However, an isolator is big, expensive, and power inefficient. It is not suitable for use in low cost, low power, portable communication systems.

Accordingly, it would be advantageous to have a circuit and a method for maintaining the optimum performance of a power amplifier under various operating conditions. It is desirable for the circuit to be simple and inexpensive. It is also desirable for the circuit to be small. It would be of further advantage for the method to be power efficient and suitable for use in low power applications.

DETAILED DESCRIPTION OF THE DRAWINGS

Generally, the present invention provides a circuit and a method for impedance matching between two circuit elements such as, for example, a power amplifier and an antenna. In accordance with the present invention, an impedance matching circuit is coupled between the two circuit elements. The impedance matching circuit samples a signal transmitted from the first circuit element to the second circuit element and a signal that may be reflected back from the second circuit element when there is an impedance mismatch between the two circuit elements. The amplitudes and the phases of the two sampled signals are compared with each other to calculate the impedance mismatch. A control logic circuit adjusts the capacitance and inductance values of variable capacitance and inductance elements in the impedance matching circuit, thereby matching the impedance of the second circuit element to that of the first circuit element and maintaining an optimum operating condition for the first circuit element.

Figure 1:
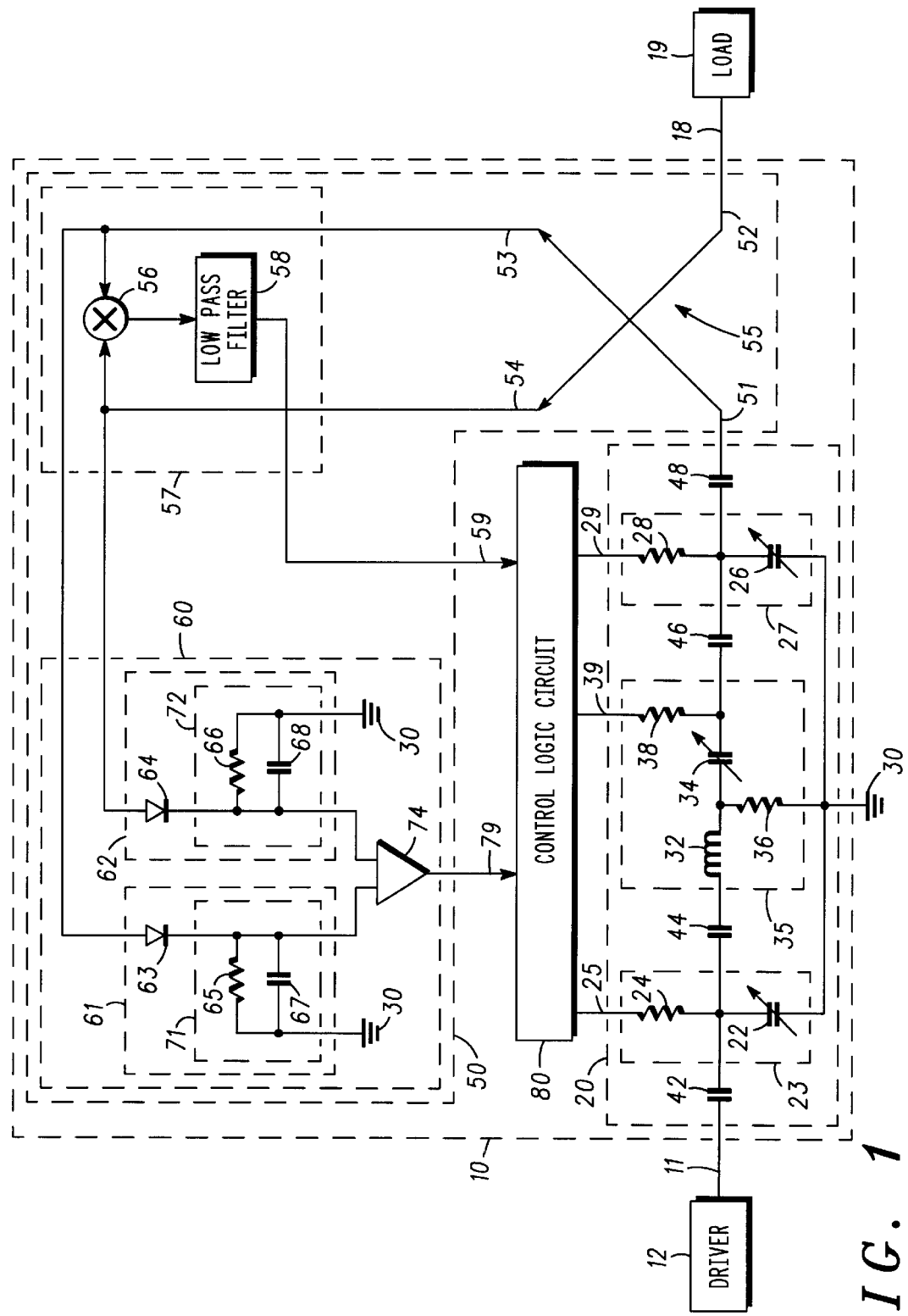
FIG. 1 is a schematic diagram of an impedance matching circuit in accordance with a first embodiment of the present invention.

FIG. 1 is a schematic diagram of an impedance matching circuit 10 in accordance with a first embodiment of the present invention. Impedance matching circuit 10, which is also referred to as an impedance matching network, has an input terminal 11 coupled to a driver 12, e.g., a power amplifier, and an output terminal 18 coupled to a load 19, e.g., an antenna. By way of example, driver 12 is designed to perform optimally when its load is a resistive load having an input impedance of approximately 50 ohms (Ω). In operation, impedance matching circuit 10 maintains an input impedance of approximately 50 Ω at terminal 11, thereby maintaining an optimal operating condition for driver 12. Impedance matching circuit 10 can be implemented as an integrated circuit, a discrete circuit, or a hybrid circuit.

Impedance matching circuit 10 includes an interface circuit 20 comprised of capacitance elements 23 and 27, an inductance element 35, and capacitors 42, 44, 46, and 48. Capacitor 42 provides direct current (DC) signal isolation between terminal 11 and capacitance element 23. Capacitor 44 provides DC signal isolation between capacitance element 23 and inductance element 35. Capacitor 46 provides DC signal isolation between inductance element 35 and capacitance element 27. Capacitor 48 provides DC signal isolation between capacitance element 27 and terminal 18. Thus, capacitors 42, 44, 46, and 48 are also referred to as DC signal blocking capacitors. If impedance matching circuit 10 is implemented as a hybrid circuit, the capacitance values of capacitors 42, 44, 46, and 48 are preferably such that they are self-resonant over the frequency range in which impedance matching circuit 10 operates. By way of example, the capacitance values of capacitors 42, 44, 46, and 48 are between approximately 10 pico-Farads (pF) and approximately 50 pF. It should be noted that it is not necessary for capacitors 42, 44, 46, and 48 to have the same capacitance.

Capacitance element 23 includes a voltage controlled variable capacitor 22 and a resistor 24. A first electrode of capacitor 22 and a first electrode of resistor 24 are connected together to form a first terminal of capacitance element 23, which is connected to one electrode of capacitor 42. The other electrode of capacitor 42 forms an input of interface circuit 20 and is connected to terminal 11 of impedance matching circuit 10. A second electrode of capacitor 22 forms a second terminal of capacitance element 23 and is connected for receiving a reference voltage at a voltage supply conductor 30. By way of example, conductor 30 is at ground voltage level. A second electrode of resistor 24 forms a control terminal 25 of capacitance element 23. The capacitance of capacitor 22 can be adjusted by a voltage signal applied to control terminal 25. Therefore, capacitance element 23 is also referred to as a variable capacitance element or an adjustable capacitance element. Capacitor 22 is referred to as a shunt capacitor. By way of example, the capacitance of capacitor 22 varies over a range from approximately 1 pF to approximately 10 pF, and the resistance of resistor 24 is between approximately 5 kilo-ohms (kΩ) and approximately 20 kΩ.

Capacitance element 27 includes a voltage controlled variable capacitor 26 and a resistor 28. A first electrode of capacitor 26 and a first electrode of resistor 28 are connected together to form a first terminal of capacitance element 27, which is connected to one electrode of capacitor 48. The other electrode of capacitor 48 forms an output of interface circuit 20 and is coupled to terminal 18 of impedance matching circuit 10. A second electrode of capacitor 26 forms a second terminal of capacitance element 27 and is connected for receiving the reference voltage at voltage supply conductor 30. A second electrode of resistor 28 forms a control terminal 29 of capacitance element 27. The capacitance of capacitor 26 can be adjusted by a voltage signal applied to control terminal 29. Therefore, capacitance element 27 is also referred to as a variable capacitance element or an adjustable capacitance element. Capacitor 26 is referred to as a shunt capacitor. By way of example, the capacitance of capacitor 26 varies over a range from approximately 1 pF to approximately 10 pF, and the resistance of resistor 28 is between approximately 5 kΩ and approximately 20 kΩ.

Inductance element 35 includes an inductor 32, a voltage controlled variable capacitor 34, and resistors 36 and 38. A first electrode of inductor 32 forms a first terminal of inductance element 35 and is coupled to the first terminal of capacitance element 23 via capacitor 44. A second electrode of inductor 32 is connected to a first electrode of capacitor 34 and to a first electrode of resistor 36. A second electrode of capacitor 34 and a first electrode of resistor 38 are connected together to form a second terminal of inductance element 35, which is coupled to the first terminal of capacitance element 27 via capacitor 46. A second electrode of resistor 36 is connected for receiving the reference voltage at voltage supply conductor 30. A second electrode of resistor 38 forms a control terminal 39 of inductance element 35. Preferably, the impedance of inductor 32 and the impedance of capacitor 34 over the frequency range in which impedance matching circuit 10 operates are such that inductance element 35 is effectively an inductive element. The inductance of inductance element 35 is determined by the inductance of inductor 32 and the capacitance of capacitor 34. Because the capacitance of capacitor 34 can be adjusted by a voltage signal applied to control terminal 39, the inductance of inductance element 35 is also adjustable. Therefore, inductance element 35 is referred to as a variable inductance element or an adjustable inductance element. Inductor 32 and capacitor 34 are referred to as a series inductor and a series capacitor, respectively. By way of example, the inductance of the inductor 32 is between approximately 5 nano-henries (nH) and approximately 40 nH, the capacitance of capacitor 34 varies over a range from approximately 1 pF to approximately 10 pF, and the resistance values of resistors 36 and 38 are between approximately 5 kΩ and approximately 20 kΩ.

The capacitance values of capacitance elements 23 and 27, and the inductance value of inductance element 35 are adjustable via voltage signals at control terminals 25, 29, and 39, respectively. Interface circuit 20 maintains a predetermined impedance, e.g., approximately 50 Ω, at terminal 11. Driver 12 is designed to perform optimally at the predetermined impedance value. When the input impedance of load 19 differs from the predetermined impedance, there is an impedance mismatch between load 19 and driver 12. Impedance mismatch is typically calculated using a Smith Chart, which is well known to those skilled in the art. It should be understood that driver 12 can also be designed to perform optimally at other impedance values. Therefore, impedance matching circuit 10 is not limited to matching the input impedance of load 19 to 50 Ω. For example, impedance matching circuit 10 can be designed to match the input impedance of load 19 to other predetermined impedance values such as, for example, 25 Ω, 75 Ω, 100 Ω, etc.

In one embodiment, the signal transmitted from driver 12 to load 19 is a Radio Frequency (RF) signal having a frequency of approximately 900 mega-Hertz and inductor 32 has an inductance of approximately 18 nH. Interface circuit 20 is capable of maintaining an input impedance of approximately 50 Ω at terminal 11 when the mismatch between the input impedance of load 19 and the predetermined impedance value is within a predetermined range. For example, interface circuit 20 is capable of maintaining the predetermined impedance at terminal 11 when the magnitude of the impedance mismatch between the input impedance of load 19 and the predetermined impedance is no greater than approximately three times the magnitude of the predetermined impedance, i.e., the mismatch is no greater than approximately 3:1. This is true regardless of whether load 19 is a resistive load, a capacitive load, or an inductive load.

In another embodiment, the signal transmitted from driver 12 to load 19 is an RF signal having a frequency of approximately 1.9 giga-Hertz and inductor 32 has an inductance of approximately 8.2 nH. Interface circuit 20 is able to maintain an input impedance of approximately 50 Ω at terminal 11 when the mismatch between the input impedance of load 19 and the predetermined impedance value is within a range no greater than approximately 3:1. This is also true regardless of whether load 19 is a resistive load, a capacitive load, or an inductive load.

However, the environment in which load 19 operates may cause the input impedance of load 19 to vary only over a limited range. For example, load 19 may be either a resistive load or a capacitive load, but not an inductive load. Thus, it is not always necessary for interface circuit 20 to be able to maintain the predetermined impedance value at terminal 11 regardless of whether load 19 is a resistive load, a capacitive load, or an inductive load. In other words, it is not always necessary for interface circuit 20 to have the full range impedance matching capability as described hereinbefore. A limited impedance matching capability is sometimes sufficient to maintain an optimum operating condition for driver 12. In this case, one of the two shunt capacitors 22 and 26 can be replaced by a fixed capacitor. Therefore, either capacitance element 23 or capacitance element 27 can be a capacitance element with a fixed capacitance value.

Impedance matching circuit 10 also includes a Voltage Standing Wave Ratio (VSWR) detection element 50 comprised of a bidirectional coupler 55, a phase comparator 57, and a magnitude comparator 60. A terminal 51 of coupler 55 serves as a first terminal of VSWR detection element 50 and is connected to the output of interface circuit 20. A terminal 52 of coupler 55 serves as a second terminal of VSWR detection element 50 and is connected to terminal 18 of impedance matching circuit 10. Coupler 55 also has sampling ports 53 and 54. In operation, a sampled signal is generated at sampling port 53 in accordance with a signal transmitted from driver 12 to load 19 via coupler 55. Likewise, a sampled signal is generated at sampling port 54 in accordance with a signal reflected back from load 19. Bidirectional couplers are well known to those skilled in the art.

Phase comparator 57 includes a mixer 56 and a low pass filter 58. A first signal port such as, for example, an RF port of mixer 56 serves as a first input of phase comparator 57 and is connected to sampling port 53 of coupler 55. A second signal port such as, for example, a Local Oscillator (LO) port of mixer 56 serves as a second input of phase comparator 57 and is connected to sampling port 54 of coupler 55. An output port such as, for example, an Intermediate Frequency (IF) port of mixer 50 is connected to an input of low pass filter 58. An output of low pass filter 58 serves as an output of phase comparator 57 and is connected to a VSWR phase output 59 of VSWR detection element 50.

Magnitude comparator 60 includes peak detectors 61 and 62, and a differential amplifier 74. Peak detector 61 rectifies a sampled signal from sampling port 53 and generates a low frequency signal which is substantially proportional to the amplitude of the signal at sampling port 53. Likewise, peak detector 62 rectifies a sampled signal from sampling port 54 and generates a low frequency signal which is substantially proportional to the amplitude of the signal at sampling port 54. Peak detectors 61 and 62 are also referred to as rectifiers. Differential amplifier 74 compares the two low frequency signals transmitted from rectifiers 61 and 62 and generates an output signal that is substantially proportional to a ratio of the amplitude of the sampled signal at sampling port 53 to that of the sampled signal at sampling port 54.

Rectifier 61 is comprised of a diode 63, a resistor 65, and a capacitor 67. An anode of diode 63 serves as a first input of magnitude comparator 60 and is connected to sampling port 53 of coupler 55. A cathode of diode 63, a first electrode of resistor 65, and a first electrode of capacitor 67 are connected together to form an output of rectifier 61, which is connected to a first input of differential amplifier 74. A second electrode of resistor 65 and a second electrode of capacitor 67 are connected for receiving the reference voltage at voltage supply conductor 30. Resistor 65 and capacitor 67 form a low pass filter 71 in rectifier 61. Likewise, rectifier 62 is comprised of a diode 64, a resistor 66, and a capacitor 68. An anode of diode 64 serves as a second input of magnitude comparator 60 and is connected to sampling port 54 of coupler 55. A cathode of diode 64, a first electrode of resistor 66, and a first electrode of capacitor 68 are connected together to form an output of rectifier 62, which is connected to a second input of differential amplifier 74. A second electrode of resistor 66 and a second electrode of capacitor 68 are connected for receiving the reference voltage at voltage supply conductor 30. Resistor 66 and capacitor 68 form a low pass filter 72 in rectifier 62. An output of differential amplifier 74 is connected to a VSWR magnitude output 79 of VSWR detection element 50.

It should be understood that the structure of VSWR detection element 50 is not limited to that shown in FIG. 1. Any circuit that is capable of comparing the phases and magnitudes of two signals of substantially the same frequency can replace VSWR detection element 50 in impedance matching circuit 10.

Impedance matching circuit 10 further includes a control logic circuit 80. A first input of control logic circuit 80 is connected to VSWR phase output 59 of VSWR detection element 50. A second input of control logic circuit 80 is connected to VSWR magnitude output 79 of VSWR detection element 50. Control logic circuit 80 also has three outputs which are connected to corresponding control terminals 25, 29, and 39 of interface circuit 20.

In operation, a signal is transmitted from driver 12 to load 19 via impedance matching circuit 10. In response to the transmitted signal, a signal will be reflected back to impedance matching circuit 10 if the input impedance of load 19 has a mismatch from the predetermined impedance value, e.g., approximately 50 Ω. The reflected signal is transmitted to terminal 52 of coupler 55. Coupler 55 samples the transmitted signal at terminal 51 and the reflected signal at terminal 52, thereby generating a sampled transmitted signal and a sampled reflected signal at sampling ports 53 and 54, respectively. Preferably, the amplitudes of the sampled transmitted signal at sampling port 53 and the sampled reflected signal at sampling port 54 are proportional to the amplitudes of the transmitted signal at terminal 51 and the reflected signal at terminal 52, respectively, and the two coefficients of proportionality are substantially equal to each other.

Mixer 56 in phase comparator 57 mixes the sampled transmitted signal and the sampled reflected signal to generate a multiplied signal at its output port. Because the transmitted signal and the reflected signal have the same frequency as each other, a low frequency component of the multiplied signal is substantially proportional to the phase difference between the two signals. This low frequency component of the multiplied signal is also referred to as a phase signal of VSWR detection element 50. The phase signal is transmitted through low pass filter 58 to VSWR phase output 59.

Rectifiers 61 and 62 rectify the sampled transmitted signal from sampling port 53 and the sampled reflected signal from sampling port 54, respectively, of coupler 55. Differential amplifier 74 compares the two rectified signals and generates an output signal that is substantially proportional to a ratio of the amplitude of the sampled transmitted signal to the amplitude of the sampled reflected signal. The output signal of differential amplifier 74 is also referred to as a magnitude signal of VSWR detection element 50. The magnitude signal is transmitted to VSWR magnitude output 79.

Control logic circuit 80 receives two control signals from VSWR detection element 50. The first control signal is the phase signal at VSWR phase output 59, and the second control signal is the magnitude signal at VSWR magnitude output 79. Based on these control signals, control logic circuit 80 generates voltage signals for adjusting capacitors 22, 26, and 34 in interface circuit 20. In one example, a memory unit (not shown), e.g., a Static Random Access Memory (SRAM) unit, in control logic circuit 80 stores a look-up table of the desired voltage values for the voltage signals corresponding to various values of the phase and magnitude signals. In another example, an algorithm is used to calculate the desired voltage values for the voltage signals corresponding to various values of the phase and magnitude signals.

Interface circuit 20 receives the voltage signals of control logic circuit 80 via control terminals 25, 29, and 39 and uses the voltage signals to adjust the capacitance values of corresponding capacitors 22, 26, and 34. The voltage signal at control terminal 25 provides a voltage bias to capacitor 22 via resistor 24 and adjusts the capacitance value of capacitance element 23. The voltage signal at control terminal 29 provides a voltage bias to capacitor 26 via resistor 28 and adjusts the capacitance value of capacitance element 27. The voltage signal at control terminal 39 provides a voltage bias to capacitor 34 via resistors 36 and 38 and adjusts the capacitance value of capacitor 34 and the inductance value of inductance element 35. Capacitance elements 23 and 27, and inductance element 35 cooperate to maintain an input impedance of approximately 50 Ω at terminal 11, thereby optimizing the performance of driver 12.

Figure 2:
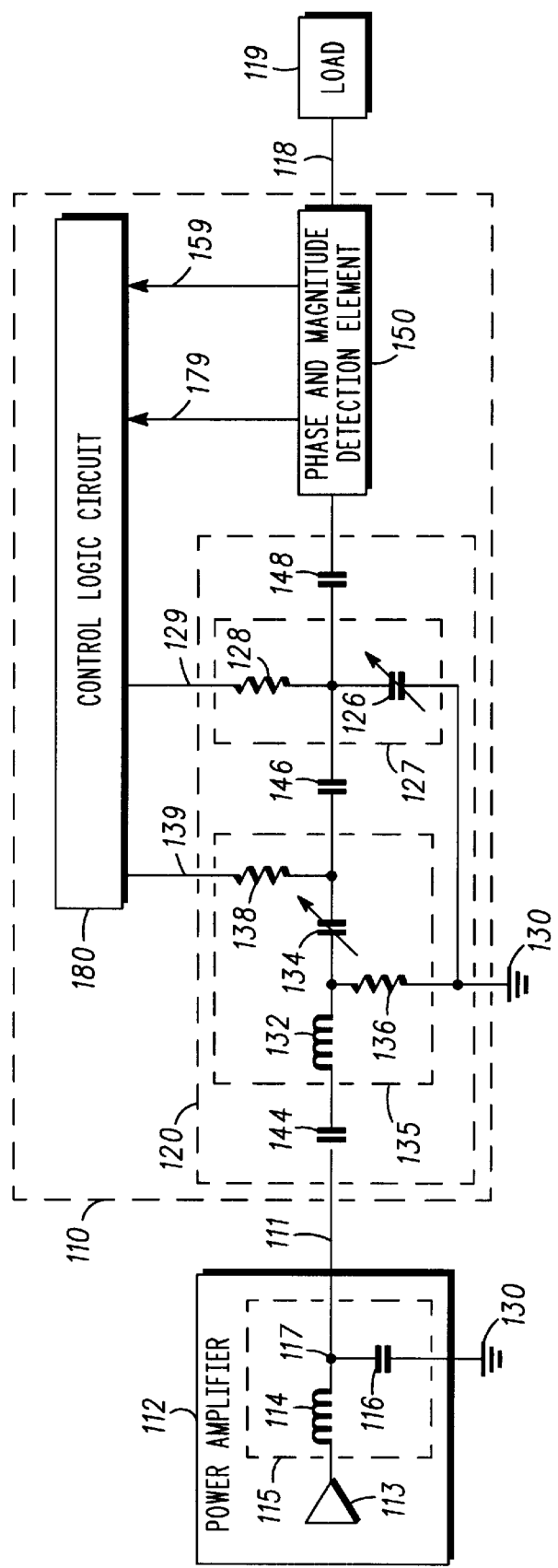
FIG. 2 is a schematic diagram of an impedance matching circuit in accordance with a second embodiment of the present invention.

FIG. 2 is a schematic diagram of an impedance matching circuit 110 in accordance with a second embodiment of the present invention. Impedance matching circuit 110, which is also referred to as an impedance matching network, has a terminal 111 coupled to a first circuit element, e.g., a power amplifier 112, and a terminal 118 coupled to a second circuit element, e.g., a load 119 of power amplifier 112. Impedance matching circuit 110 can be implemented as an integrated circuit, a discrete circuit, or a hybrid circuit.

Power amplifier 112 typically includes several amplification stages. An amplification stage 113 is shown in FIG. 2 as the last amplification stage in power amplifier 112. An inductor 114 and a capacitor 116 form an impedance matching element 115 in power amplifier 112. Inductor 114 has one electrode connected to an output of amplification stage 113. The other electrode of inductor 114 is connected to an electrode of capacitor 116 to form a node 117, which is connected to terminal 111. The other electrode of capacitor 116 is connected to a voltage supply conductor 130. By way of example, voltage supply conductor 130 is at ground voltage level.

Impedance matching circuit 110 includes an interface circuit 120 that matches the input impedance at terminal 111 to the output impedance of power amplifier 112 at the node 117. Interface circuit 120 is comprised of a capacitance element 127, an inductance element 135, and capacitors 144, 146, and 148. Capacitor 144 provides DC signal isolation between terminal 111 and inductance element 135. Capacitor 146 provides DC signal isolation between inductance element 135 and capacitance element 127. Capacitor 148 provides DC signal isolation between capacitance element 127 and terminal 118. Thus, capacitors 144, 146, and 148 are also referred to as DC signal blocking capacitors. By way of example, the capacitance values of capacitors 144, 146, and 148 are between approximately 10 pF and approximately 50 pF. If impedance matching circuit 110 is implemented as a hybrid circuit, the capacitance values of capacitors 144, 146, and 148 are preferably such that they are self-resonant over the frequency range in which impedance matching circuit 110 operates. It should be noted that it is not necessary for capacitors 144, 146, and 148 to have the same capacitance.

Inductance element 135 includes an inductor 132, a voltage controlled variable capacitor 134, and resistors 136 and 138. A first electrode of inductor 132 forms a first terminal of inductance element 135 and is coupled to terminal 111 via capacitor 144. A second electrode of inductor 132 is connected to a first electrode of capacitor 134 and to a first electrode of resistor 136. A second electrode of capacitor 134 and a first electrode of resistor 138 are connected together to form a second terminal of inductance element 135. A second electrode of resistor 136 is connected for receiving a reference voltage at voltage supply conductor 130. A second electrode of resistor 138 forms a control terminal 139 of inductance element 135. Preferably, the impedance of inductor 132 and the impedance of capacitor 134 over the frequency range in which impedance matching circuit 110 operates are such that inductance element 135 is effectively an inductive element whose inductance is determined by the inductance of inductor 132 and the capacitance of capacitor 134. Because the capacitance of capacitor 134 can be adjusted by a voltage signal applied to control terminal 139, the inductance of inductance element 135 is also adjustable. Therefore, inductance element 135 is referred to as a variable inductance element or an adjustable inductance element. By way of example, the inductance of inductor 132 is between approximately 5 nH and approximately 40 nH, the capacitance of capacitor 134 varies over a range from approximately 1 pF to approximately 10 pF, and the resistance values of resistors 136 and 138 are between approximately 5 kΩ and approximately 20 kΩ.

Capacitance element 127 includes a voltage controlled variable capacitor 126 and a resistor 128. A first electrode of capacitor 126 and a first electrode of resistor 128 are connected together to form a first terminal of capacitance element 127, which is coupled to the second terminal of inductance element 135 via capacitor 146 and connected to one electrode of capacitor 148. The other electrode of capacitor 148 forms an output of interface circuit 120 and is coupled to terminal 118 of impedance matching circuit 110. A second electrode of capacitor 126 forms a second terminal of capacitance element 127 and is connected for receiving the reference voltage at voltage supply conductor 130. A second electrode of resistor 128 forms a control terminal 129 of capacitance element 127. The capacitance of capacitor 126 can be adjusted by a voltage signal applied to control terminal 129. Therefore, capacitance element 127 is also referred to as a variable capacitance element or an adjustable capacitance element. By way of example, the capacitance of capacitor 126 varies over a range from approximately 1 pF to approximately 10 pF, and the resistance of resistor 128 is between approximately 5 kΩ and approximately 20 kΩ.

Impedance matching circuit 110 also includes a phase and magnitude detection element 150, which has a first terminal connected to the output of interface circuit 120 and a second terminal connected to terminal 118 of impedance matching circuit 110. Phase and magnitude detection element 150 also has a phase output 159 and a magnitude output 179. In a preferred embodiment, phase and magnitude detection element 150 is functionally identical to VSWR detection element 50 of impedance matching circuit 10 shown in FIG. 1.

Impedance matching circuit 110 further includes a control logic circuit 180. A first input of control logic circuit 180 is connected to phase output 159 of phase and magnitude detection element 150. A second input of control logic circuit 180 is connected to magnitude output 179 of phase and magnitude detection element 150. Control logic circuit 180 also has two outputs which are connected to corresponding control terminals 129 and 139 of interface circuit 120.

In operation, a signal is transmitted from power amplifier 112 to load 119 via impedance matching circuit 110. If there is an impedance mismatch between load 119 and power amplifier 112, a signal is reflected back to impedance matching circuit 110. Phase and magnitude detection element 150 compares the phase and magnitude of the reflected signal with those of the transmitted signal and generates two control signals. The first control signal is a phase signal at phase output 159, and the second control signal is a magnitude signal at magnitude output 179.

Control logic circuit 180 receives the two control signals from phase and magnitude detection element 150. Based on these control signals, control logic circuit 180 generates voltage signals for adjusting capacitors 126 and 134 in interface circuit 120. In one example, a memory unit (not shown), e.g., an SRAM unit, in control logic circuit 180 stores a look-up table of the desired voltage values for the voltage signals corresponding to various values of the phase and magnitude signals. In another example, an algorithm is used to calculate the desired voltage values for the voltage signals corresponding to various values of the phase and magnitude signals.

Interface circuit 120 receives the voltage signals of control logic circuit 180 via control terminals 129 and 139. The voltage signal at control terminal 129 provides a voltage bias to capacitor 126 via resistor 128 and adjusts the capacitance value of capacitance element 127. The voltage signal at control terminal 139 provides a voltage bias to capacitor 134 via resistors 136 and 138 and adjusts the capacitance of capacitor 134 and the inductance value of inductance element 135. Capacitance element 127 and inductance element 135 cooperate to match the input impedance at terminal 111 to the output impedance of power amplifier 112, thereby optimizing the performance of power amplifier 112.

Compared with impedance matching circuit 10 shown in FIG. 1, impedance matching circuit 110 has fewer elements, and is simpler and more cost efficient. On the other hand, impedance matching circuit 10 shown in FIG. 1 matches the input impedance of a load to a predetermined impedance value, e.g., 50 Ω, which is a standardized impedance in RF circuits. Therefore, impedance matching circuit 10 can work with any circuit element having a predetermined impedance.

By now it should be appreciated that a circuit and a method for impedance matching between two circuit elements have been provided. The impedance matching circuit samples a signal transmitted from the first circuit element to the second circuit element and a second signal that may be reflected back from the second circuit element when there is an impedance mismatch between the two circuit elements. The amplitude and the phase of the second sampled signal are compared with those of the first sampled signal to calculate the impedance mismatch. A control logic circuit adjusts the capacitance and inductance values of variable capacitance and inductance elements in the impedance matching circuit, thereby matching the input impedance of the second circuit element to the output impedance of the first circuit element and maintaining an optimum operating condition for the first circuit element. Compared with prior art isolators, the impedance matching circuit of the present invention is small, simple, and inexpensive. In addition, the circuit and the method of the present invention are power efficient and suitable for use in low power applications.

What is claimed is:

1. An impedance matching circuit, comprising:
    an interface circuit having an input, an output, and a plurality of control terminals, the interface circuit including a first capacitance element having a first terminal coupled to the input and the output of the interface circuit, and a second terminal coupled for receiving a reference voltage, wherein the first capacitance element comprises a first voltage controlled variable capacitor having a first electrode coupled to the first terminal of the first capacitance element and a second electrode coupled to the second terminal of the first capacitance element, and a first resistor having a first electrode coupled to a first control terminal of the plurality of control terminals of the interface circuit and a second electrode coupled to the first electrode of the first voltage controlled variable capacitor;
    a phase and magnitude detection element having a first terminal coupled to the output of the interface circuit, a second terminal, a phase output, and a magnitude output; and
    a control logic circuit having a first input coupled to the phase output of the phase and magnitude detection element, a second input coupled to the magnitude output of the phase and magnitude detection element, and a plurality of outputs coupled to the plurality of control terminals of the interface circuit.

2. The impedance matching circuit of claim 1, wherein the first terminal of the first capacitance element is coupled to the input of the interface circuit via a variable inductance element having a first terminal coupled to the input of the interface circuit, a second terminal coupled to the first terminal of the first capacitance element, and a control terminal coupled to a second control terminal of the plurality of control terminals of the interface circuit.

3. The impedance matching circuit of claim 2, wherein the variable inductance element includes:
    an inductor having a first electrode coupled to the first terminal of the variable inductance element, and a second electrode;
    a second voltage controlled variable capacitor having a first electrode coupled to the second electrode of the inductor and a second electrode coupled to the second terminal of the variable inductance element;
    a second resistor having a first electrode coupled to the first electrode of the second voltage controlled variable capacitor and a second electrode coupled for receiving the reference voltage; and
    a third resistor having a first electrode coupled to the control terminal of variable inductance element and a second electrode coupled to the second electrode of the second voltage controlled variable capacitor.

4. The impedance matching circuit of claim 2, wherein:
    the first terminal of the variable inductance element is coupled to the input of the interface circuit via a first blocking capacitor having a first electrode coupled to the input of the interface circuit and a second electrode coupled to the first terminal of the variable inductance element; and
    the second terminal of the variable inductance element is coupled to the first terminal of the first capacitance element via a second blocking capacitor having a first electrode coupled to the second terminal of the variable inductance element and a second electrode coupled to the first terminal of the first capacitance element.

5. The impedance matching circuit of claim 4, wherein the interface circuit further comprises a second capacitance element having a first terminal coupled to the first electrode of the first blocking capacitor and a second terminal coupled for receiving the reference voltage, the second capacitance element including:
    a second voltage controlled variable capacitor having a first electrode coupled to the first terminal of the second capacitance element and a second electrode coupled to the second terminal of the second capacitance element; and
    a second resistor having a first electrode coupled to a third control terminal of the plurality of control terminals of the interface circuit and a second electrode coupled to the first electrode of the second voltage controlled variable capacitor.

6. The impedance matching circuit of claim 5, wherein the first electrode of the first blocking capacitor is coupled to the input of the interface circuit via a third blocking capacitor having a first electrode coupled to input of the interface circuit and a second electrode coupled to the first electrode of the first blocking capacitor.

7. The impedance matching circuit of claim 2, wherein: the first terminal of the first capacitance element is coupled to the output of the interface circuit via a blocking capacitor having a first electrode coupled to the first terminal of the first capacitance element and a second electrode coupled to the output of the interface circuit.

8. The impedance matching circuit of claim 1, wherein the phase and magnitude detection element includes:
    a bidirectional coupler having a first terminal coupled to the first terminal of the phase and magnitude detection element, a second terminal coupled to the second terminal of the phase and magnitude detection element, a first sampling port, and a second sampling port;
    a phase comparator having a first input coupled to the first sampling port of the bidirectional coupler, a second input coupled to the second sampling port of the bidirectional coupler, and an output coupled to the phase output of the phase and magnitude detection element; and a magnitude comparator having a first input coupled to the first sampling port of the bidirectional coupler, a second input coupled to the second sampling port of the bidirectional coupler, and an output coupled to the magnitude output of the phase and magnitude detection element.

9. The impedance matching circuit of claim 8, wherein the phase comparator includes:

a mixer having a first signal port coupled to the first input of the phase comparator, a second signal port coupled to the second input of the phase comparator, and an output port; and a low pass filter having an input coupled to the output port of the mixer and an output coupled to the output of the phase comparator.

10. The impedance matching circuit of claim 8, wherein the magnitude comparator includes:

a first peak detector having an input coupled to the first input of the magnitude comparator, and an output;

a second peak detector having an input coupled to the second input of the magnitude comparator, and an output; and a differential amplifier having a first input coupled to the output of the first peak detector, a second input coupled to the output of the second peak detector, and an output coupled to the output of the magnitude comparator.

11. An impedance matching circuit, comprising:

a first adjustable capacitance element having a first terminal coupled for receiving a radio frequency signal, a second terminal coupled for receiving a reference voltage, and a control terminal. the first adjustable capacitance element including a first variable capacitor having a first electrode coupled to the first terminal of the first adjustable capacitance element and a second electrode coupled to the second terminal of the first adjustable capacitance element, and a first resistor having a first electrode coupled to the control terminal of the first adjustable capacitance element and a second electrode coupled to the first electrode of the first variable capacitor;

a second adjustable capacitance element having a first terminal, a second terminal coupled for receiving the reference voltage, and a control terminal;

an adjustable inductance element having a first terminal coupled to the first terminal of the first adjustable capacitance element, a second terminal coupled to the first terminal of the second adjustable capacitance element, and a control terminal;

a Voltage Standing Wave Ratio (VSWR) detection element having a first terminal coupled to the first terminal of the second adjustable capacitance element, a second terminal coupled for transmitting the radio frequency signal and receiving a reflected signal in response to the radio frequency signal, a VSWR phase output, and a VSWR magnitude output; and a control logic circuit having a first input coupled to the VSWR phase output of the VSWR detection element, a second input coupled to the VSWR magnitude output of the VSWR detection element, a first output coupled to the control terminal of the first adjustable capacitance element, a second output coupled to the control terminal of the second adjustable capacitance element, and a third output coupled to the control terminal of the adjustable inductance element.

12. The impedance matching circuit of claim 11, wherein:

the second adjustable capacitance element includes:

a second variable capacitor having a first electrode coupled to the first terminal of the second adjustable capacitance element and a second electrode coupled to the second terminal of the second adjustable capacitance element; and a second resistor having a first electrode coupled to the control terminal of the second adjustable capacitance element and a second electrode coupled to the first electrode of the second variable capacitor; and the adjustable inductance element includes:

an inductor having a first electrode coupled to the first terminal of the adjustable inductance element, and a second electrode;

a third variable capacitor having a first electrode coupled to the second electrode of the inductor and a second electrode coupled to the second terminal of the adjustable inductance element;

a third resistor having a first electrode coupled to the control terminal of the adjustable inductance element and a second electrode coupled to the second electrode of the third variable capacitor; and a fourth resistor having a first electrode coupled to the first electrode of the third variable capacitor and a second electrode coupled for receiving the reference voltage.

13. The impedance matching circuit of claim 11, wherein:

the first terminal of the first adjustable capacitance element is coupled for receiving the radio frequency signal via a first capacitor having a first electrode coupled for receiving the radio frequency signal and a second electrode coupled to the first terminal of the first adjustable capacitance element;

the first terminal of the VSWR detection element is coupled to the first terminal of the second adjustable capacitance element via a second capacitor having a first electrode coupled to the first terminal of the second adjustable capacitance element and a second electrode coupled to the first terminal of the VSWR detection element;

the first terminal of the adjustable inductance element is coupled to the first terminal of the first adjustable capacitance element via a third capacitor having a first electrode coupled to the first terminal of the first adjustable capacitance element and a second electrode coupled to the first terminal of the adjustable inductance element; and the second terminal of the adjustable inductance element is coupled to the first terminal of the second adjustable capacitance element via a fourth capacitor having a first electrode coupled to the second terminal of the adjustable inductance element and a second electrode coupled to the first terminal of the second adjustable capacitance element.

14. The impedance matching circuit of claim 11, wherein the VSWR detection element includes:

a bidirectional coupler having a first terminal coupled to the first terminal of the VSWR detection element, a second terminal coupled to the second terminal of the VSWR detection element, a first sampling port, and a second sampling port;

a first rectifier having a first terminal coupled to the first sampling port of the bidirectional coupler, and a second terminal;

a second rectifier having a first terminal coupled to the second sampling port of the bidirectional coupler, and a second terminal;

a differential amplifier having a first input coupled to the second terminal of the first rectifier, a second input coupled to the second terminal of the second rectifier, and an output coupled to the VSWR magnitude output of the VSWR detection element;

a mixer having a first signal port coupled to the first sampling port of the bidirectional coupler, a second signal port coupled to the second sampling port of the bidirectional coupler, and an output port; and a low pass filter having an input coupled to the output port of the mixer and an output coupled to the VSWR phase output of the VSWR detection element.

15. The impedance matching circuit of claim 14, wherein:

the first rectifier includes a first diode having an anode coupled to the first terminal of the first rectifier, and a cathode, and a first filter having an input coupled to the cathode of the first diode and an output coupled to the second terminal of the first rectifier; and the second rectifier includes a second diode having an anode coupled to the first terminal of the second rectifier, and a cathode, and a second filter having an input coupled to the cathode of the second diode and an output coupled to the second terminal of the second rectifier.

* * * * *